(12) United States Patent
Kwan

(10) Patent No.: US 6,924,882 B2
(45) Date of Patent: *Aug. 2, 2005

(54) BALANCED POSITIONING SYSTEM FOR USE IN LITHOGRAPHIC APPARATUS

(75) Inventor: Yim Bun P. Kwan, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 10/649,608

(22) Filed: Aug. 28, 2003

(65) Prior Publication Data

US 2004/0041994 A1 Mar. 4, 2004

Related U.S. Application Data

(63) Continuation of application No. 10/209,926, filed on Aug. 2, 2002, now Pat. No. 6,671,036, which is a continuation of application No. 09/739,098, filed on Dec. 19, 2000, now Pat. No. 6,449,030.

(30) Foreign Application Priority Data

Dec. 21, 1999 (EP) ............................................. 99310371

(51) Int. Cl.⁷ ........................ G03B 27/42; G03B 27/58; G03B 27/62
(52) U.S. Cl. ........................... 355/53; 355/72; 355/355; 355/75
(58) Field of Search ............................... 355/53, 72–75; 318/640, 687; 378/34, 35

(56) References Cited

U.S. PATENT DOCUMENTS

| | | | |
|---|---|---|---|
| 4,768,064 A | 8/1988 | Isohata et al. | |
| 4,781,067 A | 11/1988 | Cichanski | |
| 5,073,912 A | 12/1991 | Kobayashi et al. | |
| 5,150,153 A | 9/1992 | Franken et al. | |
| 5,172,160 A | 12/1992 | Van Eijk et al. | |
| 5,208,497 A | 5/1993 | Ishii et al. | |
| 5,229,670 A | 7/1993 | Kagawa | |
| 5,229,872 A | 7/1993 | Mumola | |
| 5,296,891 A | 3/1994 | Vogt et al. | |
| 5,301,013 A | 4/1994 | Meijer et al. | |
| 5,446,519 A | 8/1995 | Makinouchi | |

(Continued)

FOREIGN PATENT DOCUMENTS

| | | |
|---|---|---|
| EP | 0 421 527 A1 | 4/1991 |
| EP | 0 498 496 | 8/1992 |
| EP | 0 525 872 | 2/1993 |
| EP | 557 100 | 1/1999 |
| GB | 2 299 867 | 10/1996 |
| JP | 3 273607 | 12/1991 |
| WO | WO97/33205 | 9/1997 |
| WO | WO98/28665 | 7/1998 |
| WO | WO 98/40791 | 9/1998 |

OTHER PUBLICATIONS

Thomas W. Novak, A New VLSI Printer, SPIE vol. 135 Developments in Semiconductor Microlithography III, 1978, 36–44.

Primary Examiner—Henry Hung Nguyen
(74) Attorney, Agent, or Firm—Pillsbury Winthrop Shaw Pittman LLP

(57) ABSTRACT

A balanced positioning system for use in lithographic apparatus having a pair of balance masses which are supported so as to be moveable in at least one degree of freedom, such as Y translation. Oppositely directed drive forces in this degree of freedom act directly between the driven body and the balance masses to rotate the driven body about an axis perpendicular to the one direction. Reaction forces arising from positioning movements result in linear movements of the balance masses and all reaction forces are kept within the balanced positioning system.

61 Claims, 5 Drawing Sheets

U.S. PATENT DOCUMENTS

| | | |
|---|---|---|
| 5,477,304 A | 12/1995 | Nishi |
| 5,504,407 A | 4/1996 | Wakui et al. |
| 5,523,193 A | 6/1996 | Nelson |
| 5,528,118 A | 6/1996 | Lee |
| 5,537,186 A | 7/1996 | Korenaga et al. |
| 5,623,853 A | 4/1997 | Novak et al. |
| 5,715,064 A | 2/1998 | Lin |
| 5,750,897 A | 5/1998 | Kato |
| 5,763,966 A | 6/1998 | Hinds |
| 5,812,958 A | 9/1998 | Mayama |
| 5,815,246 A | 9/1998 | Sperling et al. |
| 5,826,129 A | 10/1998 | Hasebe et al. |
| 5,844,664 A | 12/1998 | Van Kimmenade et al. |
| 5,874,820 A | 2/1999 | Lee |
| 5,959,427 A | 9/1999 | Watson |
| 5,969,441 A | 10/1999 | Loopstra et al. |
| 5,981,118 A | 11/1999 | Yasutake et al. |
| 5,996,437 A | 12/1999 | Novak et al. |
| 6,002,465 A | 12/1999 | Korenaga |
| 6,027,262 A | 2/2000 | Akimoto |
| 6,028,376 A | 2/2000 | Osanai et al. |
| 6,170,622 B1 | 1/2001 | Wakui et al. |
| 6,213,443 B1 | 4/2001 | Wakui |
| 6,246,204 B1 | 6/2001 | Ebihara et al. |
| 6,252,234 B1 | 6/2001 | Hazelton et al. |
| 6,252,370 B1 | 6/2001 | Ebihara et al. |
| 6,255,795 B1 | 7/2001 | Ebihara et al. |
| 6,255,796 B1 | 7/2001 | Ebihara et al. |
| 6,262,796 B1 | 7/2001 | Loopstra et al. |
| 6,271,640 B1 | 8/2001 | Lee |
| 6,281,655 B1 | 8/2001 | Poon et al. |
| 6,286,655 B1 | 9/2001 | Grubbs et al. |
| 6,323,935 B1 | 11/2001 | Ebihara et al. |
| 6,329,780 B1 | 12/2001 | Ebihara et al. |
| 6,337,484 B1 | 1/2002 | Loopstra et al. |
| 6,408,045 B1 * | 6/2002 | Matsui et al. .................. 378/34 |
| 6,449,030 B1 | 9/2002 | Kwan |
| 6,504,160 B2 * | 1/2003 | Itoh et al. ............... 250/442.11 |
| 6,525,803 B2 | 2/2003 | Kwan et al. |
| 6,671,036 B2 * | 12/2003 | Kwan .......................... 355/72 |
| 2002/0017890 A1 | 2/2002 | Ebihara et al. |

* cited by examiner

BALANCED POSITIONING SYSTEM FOR USE IN LITHOGRAPHIC APPARATUS

This is a continuation application of U.S. application Ser. No. 10/209,926, filed Aug. 2, 2002 now U.S. Pat. No. 6,671,036, which is a continuation application of U.S. application Ser. No. 09/739,098, filed Dec. 19, 2000, which is now U.S. Pat. No. 6,449,030, which claims priority from European Patent application No. 99310371.2, filed Dec. 21, 1999, the entire contents of which are hereby incorporated by reference.

BACKGROUND OF THE INVENTION

1. Field of the Invention

The present invention relates to balanced positioning systems. More particularly, the invention relates to such systems in lithographic projection apparatus comprising:

a radiation system for supplying a projection beam of radiation;

a first object table for holding a mask;

a second object table for holding a substrate; and a projection system for imaging an irradiated portion of the mask onto a target portion of the substrate.

2. Discussion of Related Art

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The radiation system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatus are described in International Patent Applications WO 98/28665 and WO 98/40791, for example.

Lithographic projection apparatus can be used, for example, in the manufacture of integrated circuits (ICs). In such a case, the mask (reticle) may contain a circuit pattern corresponding to an individual layer of the IC, and this pattern can be imaged onto a target portion (comprising one or more dies) on a substrate (silicon wafer) which has been coated with a layer of photosensitive material (resist). In general, a single wafer will contain a whole network of adjacent target portions which are successively irradiated via the mask, one at a time. In one type of lithographic projection apparatus, each target portion is irradiated by exposing the entire mask pattern onto the target portion at once; such an apparatus is commonly referred to as a wafer stepper. In an alternative apparatus—which is commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned from International Patent Application WO 97/33205.

In a lithographic apparatus, reactions on the machine frame to acceleration forces used to position the mask (reticle) and substrate (wafer) to nanometer accuracies are a major cause of vibration, impairing the accuracy of the apparatus. To minimise the effects of vibrations, it is possible to provide an isolated metrology frame on which all position sensing devices are mounted, and to channel all reaction forces to a so-called force or reaction frame that is separated from the remainder of the apparatus.

U.S. Pat. No. 5,208,497 describes a system in which the reaction of the driving force is channeled to a balance mass which is normally heavier than the driven mass and which is free to move relative to the remainder of the apparatus. The reaction force is spent in accelerating the balance mass and does not significantly affect the remainder of the apparatus. However, the concept disclosed in U.S. Pat. No. 5,208,497 is only effective for reaction forces in one direction and is not readily extendable to systems having multiple degrees of freedom. Balance masses moveable in three degrees of freedom in a plane are described in WO 98/40791 and WO 98/28665 (mentioned above).

EP-A-0,557,100 describes a system which relies on actively driving two masses in opposite directions so that the reaction forces are equal and opposite and so cancel out. The system described operates in two dimensions but the active positioning of the balance mass necessitates a second positioning system of equal quality and capability to that driving the primary object.

None of the above systems is particularly effective at counteracting yawing moments which may be induced by adjustments of the rotational position of the driven mass or because of misalignment between the line of action of forces exerted on the driven body and its center of mass.

U.S. Pat. No. 5,815,246 discloses a positioning system having a first balance mass free to move in an XY plane, i.e. to translate in X and Y and rotate about axes parallel to the Z direction. To control rotation of the first balance mass, a fly wheel, forming a second balance mass, is driven by a rotation motor mounted on the first balance mass to exert a counter-acting torque. Controlling rotation of the first balance mass therefore requires accurate control of the rotation and the flywheel. Any delay in this control or imbalance of the flywheel will cause vibration.

SUMMARY OF THE INVENTION

An object of the present invention is to provide an improved balanced positioning system for counteracting yawing moments in the driven mass and preferably also force balancing in at least two translational degrees of freedom.

According to the present invention there is provided a lithographic projection apparatus comprising:

a radiation system for supplying a projection beam of radiation;

a first object table for holding a mask;

a second object table for holding a substrate;

projection system for imaging irradiated portions of the mask onto target portions of the substrate; characterized by:

a balanced positioning system for positioning at least one of said object tables and comprising:

first and second balance masses;

bearing means for supporting said first and second balance masses so as to be substantially free to translate in at least one direction; and driving means for acting directly between said one object table and said first and second balance masses to rotate said object table about an axis perpendicular to said one direction, said driving means being arranged to exert linear forces on said first and second balance masses in opposite directions to effect said rotation of said object table.

By providing two balance masses that can translate in at least one direction, the torque required to drive the object table to adjust its rotational position, or to compensate for torques induced by other driving forces can be provided as the sum of two linearly acting forces acting between the object table and the two balance masses. The reaction forces on the two balance masses will cause them to move linearly, which can easily be accommodated. In other words, the reaction to a torque exerted on the driven object table is converted to translations of the two balance masses and no rotational movement of the balance mass occurs. It will be appreciated that if a rotational motion of the object table is combined with a linear motion, the net forces acting on each balance mass may be in the same direction, though different in magnitude.

According to a yet further aspect of the invention there is provided a method of manufacturing a device using a lithographic projection apparatus comprising:

a radiation system for supplying a projection beam of radiation;

a first object table for holding a mask;

a second object table for holding a substrate; and a projection system for imaging irradiated portions of the mask onto target portions of the substrate; the method comprising the steps of:

providing a mask bearing a pattern to said first object table;

providing a substrate provided with a radiation-sensitive layer to said second object table;

irradiating portions of the mask and imaging said irradiated portions of the mask onto said target portions of said substrate; characterized in that:

at least one of said object tables is positioned using a positioning system which includes first and second balance masses free to move in at least one direction and drive means acting between said one object table and said balance masses; and during or prior to said irradiating step said one object table is rotated by exerting oppositely directed forces between it and said first and second balance masses.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997,ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation or particle flux, including, but not limited to, ultraviolet radiation (e.g. at a wavelength of 365 nm, 248 nm, 193 nm, 157 nm or 126 nm), EUV, X-rays, electrons and ions.

Embodiments of the present invention are described below making reference to a Cartesian coordinate system with axes denoted X, Y and Z in which the XY plane is parallel to the nominal substrate and reticle surfaces. The notation Ri is used to denote rotation about an axis parallel to the I direction.

BRIEF DESCRIPTION OF THE DRAWINGS

The present invention will be described below with reference to exemplary embodiments and the accompanying schematic drawings, in which.

In the drawings, like reference numerals indicate like parts.

DETAILED DESCRIPTION OF THE EMBODIMENTS

Embodiment 1

Figure 1:
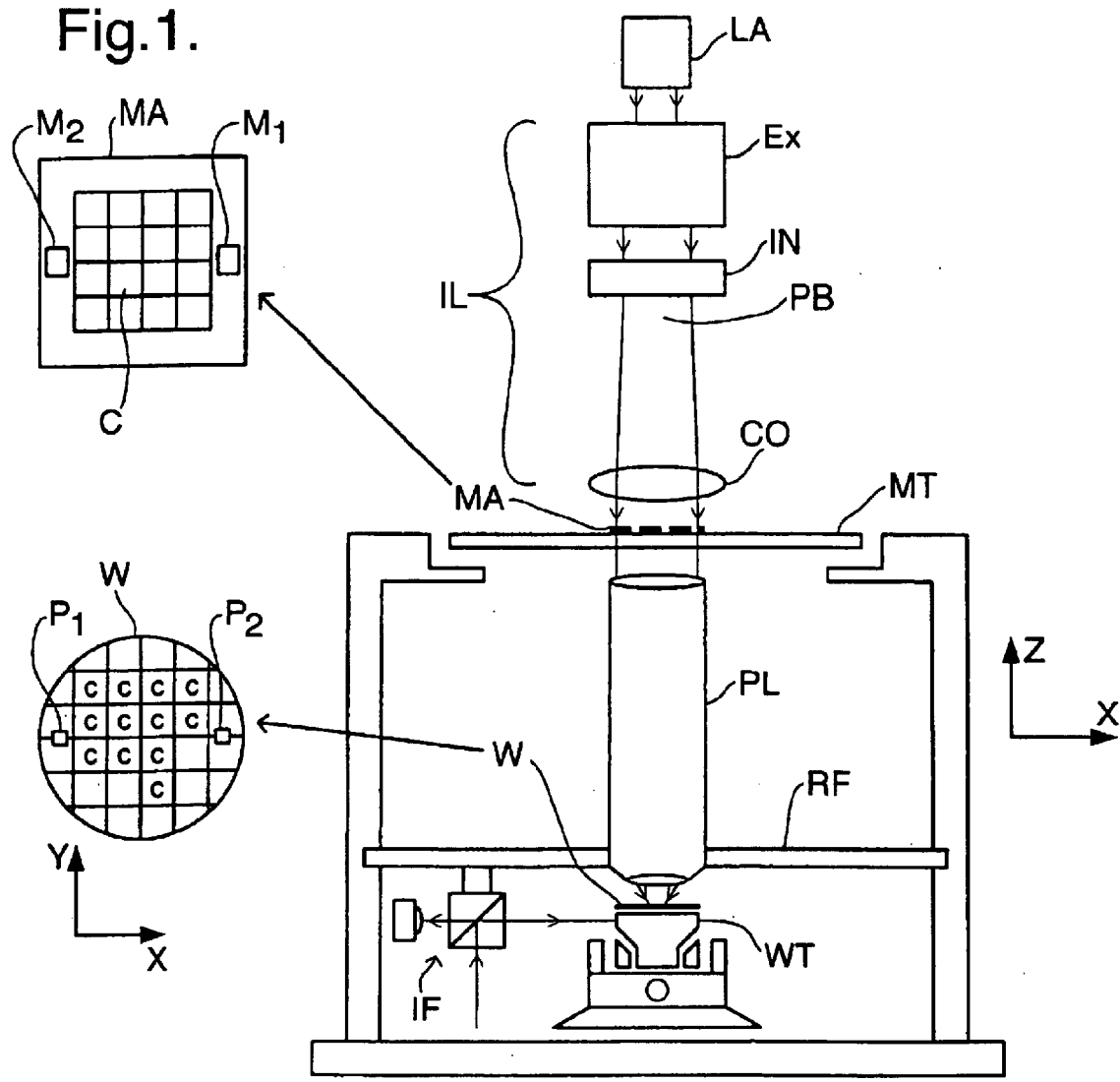
FIG. 1 depicts a lithographic projection apparatus according to a first embodiment of the invention.

FIG. 1 schematically depicts a lithographic projection apparatus according to the invention. The apparatus comprises:

a radiation system LA, IL for supplying a projection beam PB of radiation (e.g. UV or EUV radiation, x-rays, electrons or ions);

a first object table (mask table) MT for holding a mask MA (e.g. a reticle), and connected to first positioning means for accurately positioning the mask with respect to item PL;

a second object table (substrate table) WT for holding a substrate W (e.g. a resist-coated silicon wafer), and connected to second positioning means for accurately positioning the substrate with respect to item PL;

a projection system ("lens") PL (e.g. a refractive or catadioptric system, a mirror group or an array of field deflectors) for imaging an irradiated portion of the mask MA onto a target portion C (comprising one or more dies) of the substrate W.

As here depicted, the apparatus is of a transmissive type (i.e. has a transmissive mask). However, in general, it may also be of a reflective type, for example.

The radiation system comprises a source LA (e.g. a Hg lamp, excimer laser, an undulator provided around the path of an electron beam in a storage ring or synchrotron, or an electron or ion beam source) which produces a beam of radiation. This beam is caused to traverse various optical components comprised in the illumination system IL, —e.g. beam shaping optics Ex, an integrator IN and a condenser CO—so that the resultant beam PB has a desired shape and intensity throughout its cross-section.

The beam PB subsequently intercepts the mask MA which held on a mask table MT. Having traversed the mask MA, the beam PB is caused to traverse the lens PL, which focuses the beam PB onto a target portion C of the substrate W. With the aid of the interferometric displacement measuring means IF, the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library. The reference signs M1, M2 correspond to reticle alignment marks and the references P1 and P2 correspond to wafer alignment marks. These marks are used to align the wafer and the reticle respective to each other. In general, movement of the object tables MT, WT can be realized with the aid of a long stroke module (coarse positioning) and a short stroke module (fine positioning), which are not explicitly depicted in FIG. 1.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given reference direction (the so-called "scan direction", e.g. the Y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
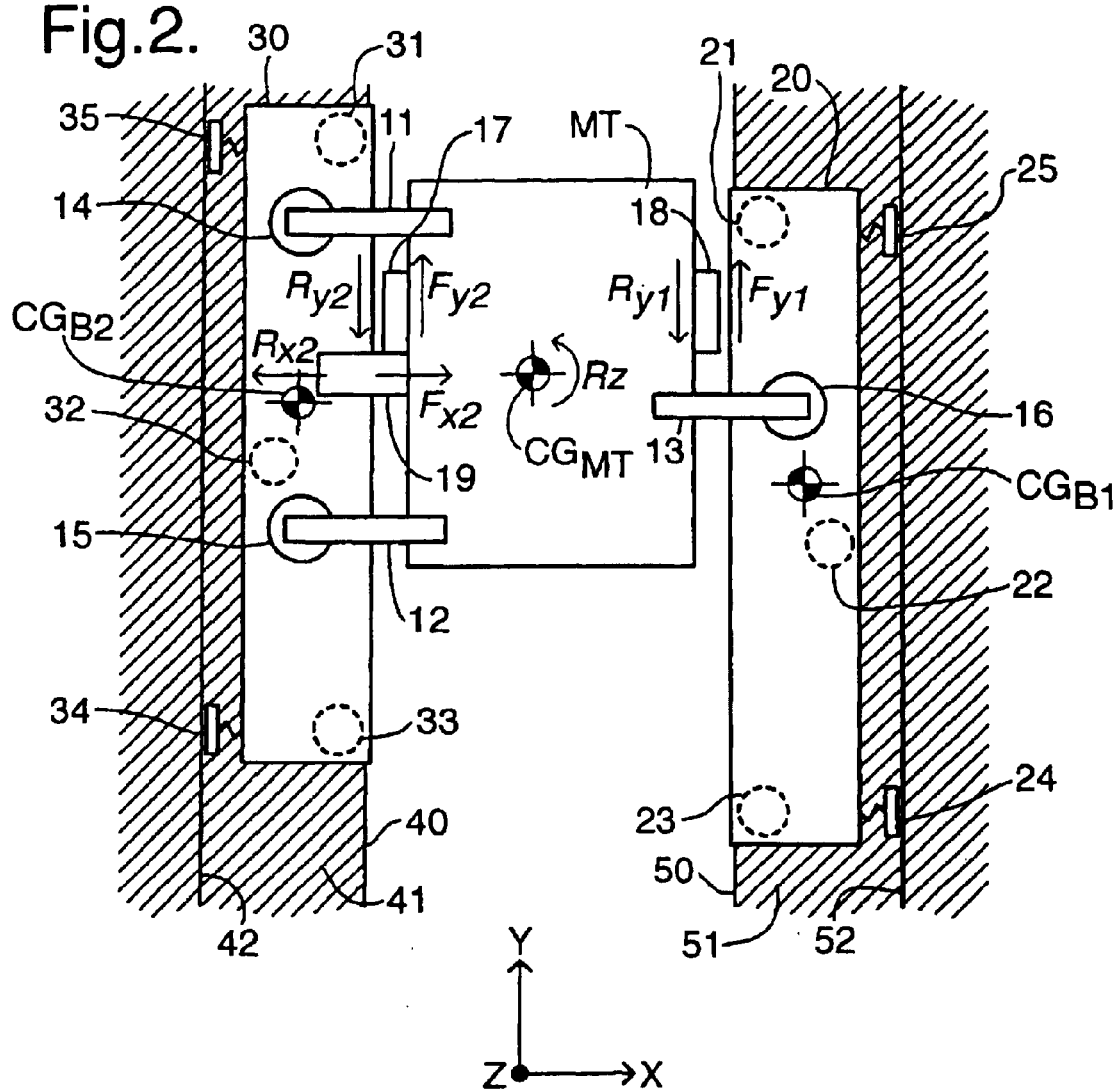
FIG. 2 is a plan view of the reticle stage of the apparatus of FIG. 1.
Figure 3:
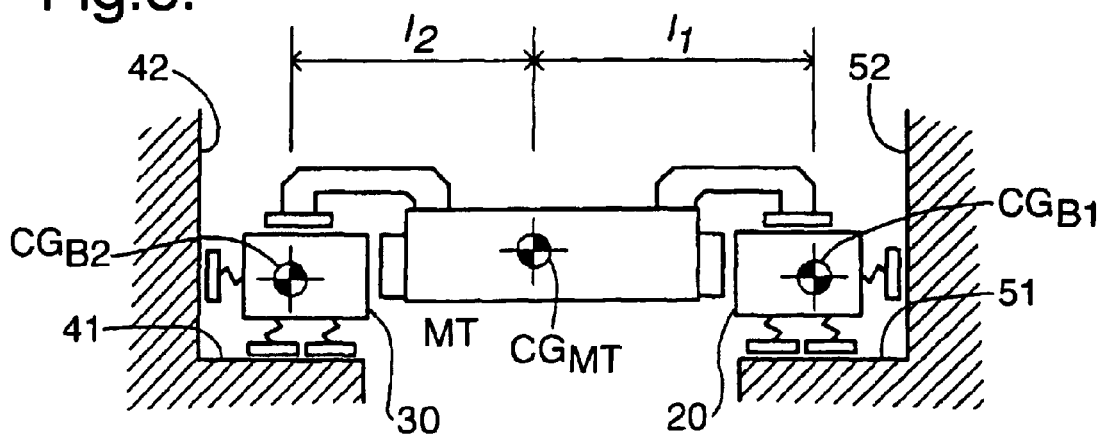
FIG. 3 is an end view of the reticle stage of the apparatus of FIG. 1.

FIGS. 2 and 3 show the reticle (mask) stage of the first embodiment of the invention in greater detail. The mask MA (not shown in FIG. 2), whose pattern is to be imaged onto the wafer, is held on mask table MT. To accommodate the scan mode of the apparatus the mask must be positioned accurately over a relatively wide range of movement (stroke) in the Y direction but only over much smaller ranges of movement in the other degrees of freedom. This large Y-direction stroke, as well as a more limited stroke in the X-direction and some Rz movement, is effected by the long stroke (coarse positioning) module described below. Fine positioning in all six degrees of freedom is accomplished by shortstroke position actuators included in the mask table.

Mask table MT depicted in FIGS. 2 and 3 is intended for use with transmissive masks which means that the space above and below it must be kept clear. Accordingly, mask table MT is supported from two balance masses 20, 30 positioned either side of a clear space extending in the Y-direction. In the present embodiment, three beams 11, 12, 13, which extend transversely from mask table MT, are provided for this purpose but the beams may alternatively be formed integrally with the body of mask table MT or the mask table may itself extend over the balance masses 20, 30. Balance masses 20, 30 have parallel planar upper surfaces against which table bearings 14, 15, 16 provided on the ends of beams 11, 12, 13 act to support the mask table. Table bearings 14, 15, 16 allow mask table MT to move in the XY plane relative to balance masses 20, 30 substantially without friction. Table bearings 14, 15, 16 may, for example, be gas bearings. Z-direction actuators may also be included in these bearings for coarse positioning in Z, Rx and Ry.

Balance masses 20, 30 are supported by substantially frictionless Z-bearings 21, 22, 23, 31, 32, 33 on parallel rails 40, 50 which extend in the Y-direction and may be part of or connected to the main machine frame, or base plate, BP. Rails 40, 50 have substantially flat horizontal upper surfaces 41, 51 against which Z-bearings 21, 22, 23, 31, 32, 33 act so that the balance masses 20, 30 are free to move in the Y-direction over a relatively wide range of motion. Z-bearings 21, 22, 23, 31, 32, 33 may be compliant, i.e. have a low stiffness, in the Z-direction so that the balance masses 20, 30 are also substantially free to move in the Z-direction, though over a much smaller range of movement. Freedom for the balance masses to move in the X-direction may be similarly provided by compliant X-bearings 24, 25, 34, 35 acting against substantially planar vertical walls 42, 52 of the rails 40, 50. X-bearings 24, 25, 34, 25 may be preloaded or opposed pad bearings to exert forces in both directions. Z-bearings 21, 22, 23, 31, 32, 33 and X-bearings 24, 25, 34, 35 may be, for example, gas bearings. The balance masses 20, 30 are thus free to move in all three translational degrees of freedom and so provide balancing to the mask table in those directions. Rotational balancing in Rx and Ry is provided because the Z-bearings 21, 22, 23, 31, 32, 33 can be moved independently and are spaced apart. Balancing for Ry movements is provided by differentially driving the two balance masses 20, 30, as is discussed below.

If the ranges of movement of the mask table in the degrees of freedom other than Y translation are small, as is the case in the present embodiment, the necessary freedom of movement of the balance masses can also be accommodated by leaf spring arrangements, compliant bearings or other stiff bearings in combination with a gravity compensator. It is also possible to arrange that reaction forces in some or all of the other degrees of freedom are only transmitted to one of the balance masses so that only that balance mass needs to be supported with controlled compliance in the relevant degrees of freedom.

The stiffness of the bearings or supports in the other degrees of freedom and the mass of the balance mass(es) form a mass-spring system that acts as a low-pass filter, i.e. only low frequency forces are transmitted to the machine frame. Significant attenuation of the reaction forces can be obtained if the natural frequency of this mass-spring system is substantially, for example 5 to 50 times, lower than the fundamental frequency of the actuation forces.

As will be described below, the mask table MT is driven by actuators acting against the balance masses 20, 30 so that they accelerate in the opposite direction to the mask table MT. The magnitudes of the accelerations of the balance masses and the mask table MT will be proportional to their masses and so the ranges of movement of the balance masses and the mask table in the various directions must be in the ratio of their masses. To reduce the ranges of movement that must be provided for the balance masses 20, 30 to accommodate the desired ranges of movement of the mask table MT, the balance masses 20, 30 are made relatively massive, e.g. each 2 to 10 times the mass of the mask table MT. The centers of mass of the balancing masses 20, 30 and mask table MT are preferably as close as possible in the Z-direction, e.g. substantially less than 100 mm, in order to minimise pitching or rolling moments.

In the present embodiment, the mask table MT is driven in the Y-direction by Y1-drive 18 acting between it and balance mass 20 and Y2-drive 17 acting between it and balance mass 30. Y1- and Y2-drives 17, 18 may, for example, comprise linear motors with an armature mounted to the mask table MT and an elongate stator mounted to the respective balance mass. Yi-drive exerts, in operation, a force $F_{yi}$ on the mask table MT and an equal and opposite reaction force $R_{yi}$ on the respective balance mass.

Positioning in the X-direction is effected by a single X-actuator 19 acting against balance mass 30. X-actuator 19 may also be a linear motor with armature mounted to the mask table and stator mounted to the balance mass or may be an elongated voice-coil motor free to displace in the Y-direction, or a cylindrical voice-coil motor coupled to an aerostatic bearing that bears against a surface parallel to the YZ plane. To enable the mask table to be driven in the X-direction whatever the relative Y position of the mask table MT and balance mass 30, if X-actuator is a linear motor, the stator must extend the whole of the combined range of movement of the balance mass and mask table in the Y direction. The line of action of the X-actuator 19 is preferably arranged to pass through at least the Y-position of the center of gravity $CG_{MT}$ of the mask table MT so as to minimise the generation of Rz moments.

It follows from Newton's laws that if there is no rotational movement of the mask table, the displacements $\Delta y_{b1}$, $\Delta Y_{b2}$ and $\Delta Y_{MT}$ of the balance masses 20, 30 and mask table MT satisfy the following conditions:

$$\frac{\Delta y_{MT}}{\Delta y_{b1}} = -\frac{m_{b1}}{m_{MT}} \cdot \frac{l_1 + l_2}{l_2}; \frac{\Delta y_{MT}}{\Delta y_{b2}} = -\frac{m_{b2}}{m_{MT}} \cdot \frac{l_1 + l_2}{l_2} \quad [1]$$

where:

$l_1$ and $l_2$ are respectively the distances in the X-direction between the centers of gravity $CG_{B1}$, $CG_{B2}$ of the balance masses 20, 30 and the center of gravity $CG_{MT}$ of the mask table MT; and $m_{b1}$, $m_{b2}$ and $m_{MT}$ are the masses of the balance masses 20, 30 and mask table MT.

If $m_{b1}=m_{b2}=m_b$ and $l_1=l_2$, then equation 1 can be reduced to:

$$\Delta y_{b1} = \Delta y_{b2} = -\Delta y_{MT} \cdot \frac{m_{MT}}{2m_b} \quad [2]$$

To effect a yawing (Rz) movement of the mask stage whilst still containing the reaction forces within the balance mass system, the forces applied by Y1- and Y2-drives 17, 18 are controlled to take advantage of D'Alambert forces by moving the balance masses in opposite directions. Note that if the yawing motion is effected at the same time as a movement in Y, the balance masses may move in the same direction but by differing amounts, thus the movement in opposite directions is relative rather than absolute. For a counter-clockwise movement of the mask stage by an angle $\theta_{MT}$ the necessary relative movements of the balance masses are given by:

$$\Delta y_{b1} = -\frac{J_{MT} \cdot \theta_{MT}}{(l_1 + l_2) \cdot m_1}; \Delta y_{b2} = -\frac{J_{MT} \cdot \theta_{MT}}{(l_1 + l_2) \cdot m_2} \quad [3]$$

where $J_{MT}$ is the moment of inertia of the mask table MT.

It should be noted that the present invention does not require the masses of the first and second balance masses to be equal nor that they be disposed equidistantly about the centre of gravity of the mask table.

In a perfect, closed system, the combined center of mass of the mask table MT and balance masses 20, 30 will be stationary, however it is preferable to provide a negative feedback servo system to correct long-term cumulative translations (drift) of the balance masses that might arise from such factors as: cabling to the mask table and drives, misalignment of the drives, minute friction in the bearings, the apparatus not being perfectly horizontal, etc. As an alternative to the active drift control system described below, a passive system, e.g. based on low-stiffness springs, may be used.

Figure 4:
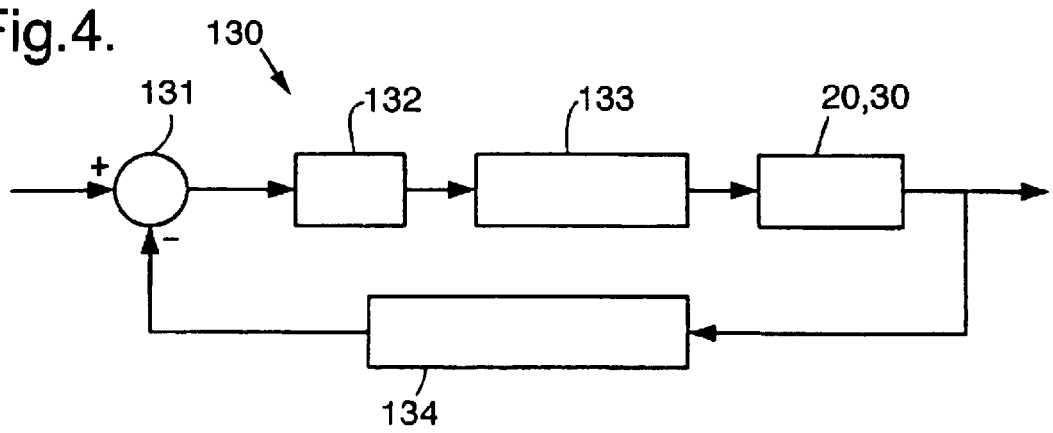
FIG. 4 is a diagram of a servo control mechanism used in the first embodiment of the present invention.

FIG. 4 shows the control loop of the servo system 130. The Y and Rz setpoints of the balance masses with respect to the machine frame are supplied to the positive input of subtractor 131, whose output is passed to the servo controller 132. Feedback to the negative input of subtractor 131 is provided by one or more multiple-degree-of-freedom measurement systems 134 which measure the positions of the balance masses and driven mass (mask table). The servo controller controls a two-degree-of-freedom actuator system 133 which applies the necessary corrections to the balance masses 20, 30. The positions of both balance masses and driven mass may be measured relative to a fixed frame of reference. Alternatively, the position of one, e.g the balance masses, may be measured relative to the reference frame and the position of the driven mass measured relative to the balance masses. In the latter case the relative position data can be transformed to absolute position data either in software or by hardware. Particularly in the Y-direction, the position measurement may be performed by a linear encoder with a high tolerance to residual relative movements in the other degrees of freedom, such as those described in U.S. Pat. No. 5,646,730, for example.

The set points of the servo system 130 are determined so as to ensure that the combined center of mass of the mask table MT and balance masses 20, 30 remains unchanged in the X, Y, Rz plane. This defines the condition:

$$m_{MT} \cdot \vec{u}_{MT}(t) + m_{b1} \cdot \vec{u}_{b1}(t) + m_{b2} \cdot \vec{u}_{b2}(t) = m_{MT} \cdot \vec{u}_{MT}(O) + m_{b1} \cdot \vec{u}_{b1}(O) + m_{b2} \cdot \vec{u}_{b2}(O) \quad [4]$$

where $\vec{u}_i(t)$ is the vector position of mass i in the X-Y plane at time t relative to a fixed reference point. The error signal between the calculated (using equation [4]) and measured positions is provided to the actuation system 133 which applies appropriate correction forces to the balance masses 20, 30. The lowest resonance mode of the balancing frame and/or machine base is preferably at least a factor of five higher than the servo bandwidth of the drift control system.

The above described servo system can be used in the Y-direction only with drift control in the other degrees of freedom being performed by the low stiffness of the supports for the balance masses in those degrees of freedom.

Embodiment 2

Figure 5:
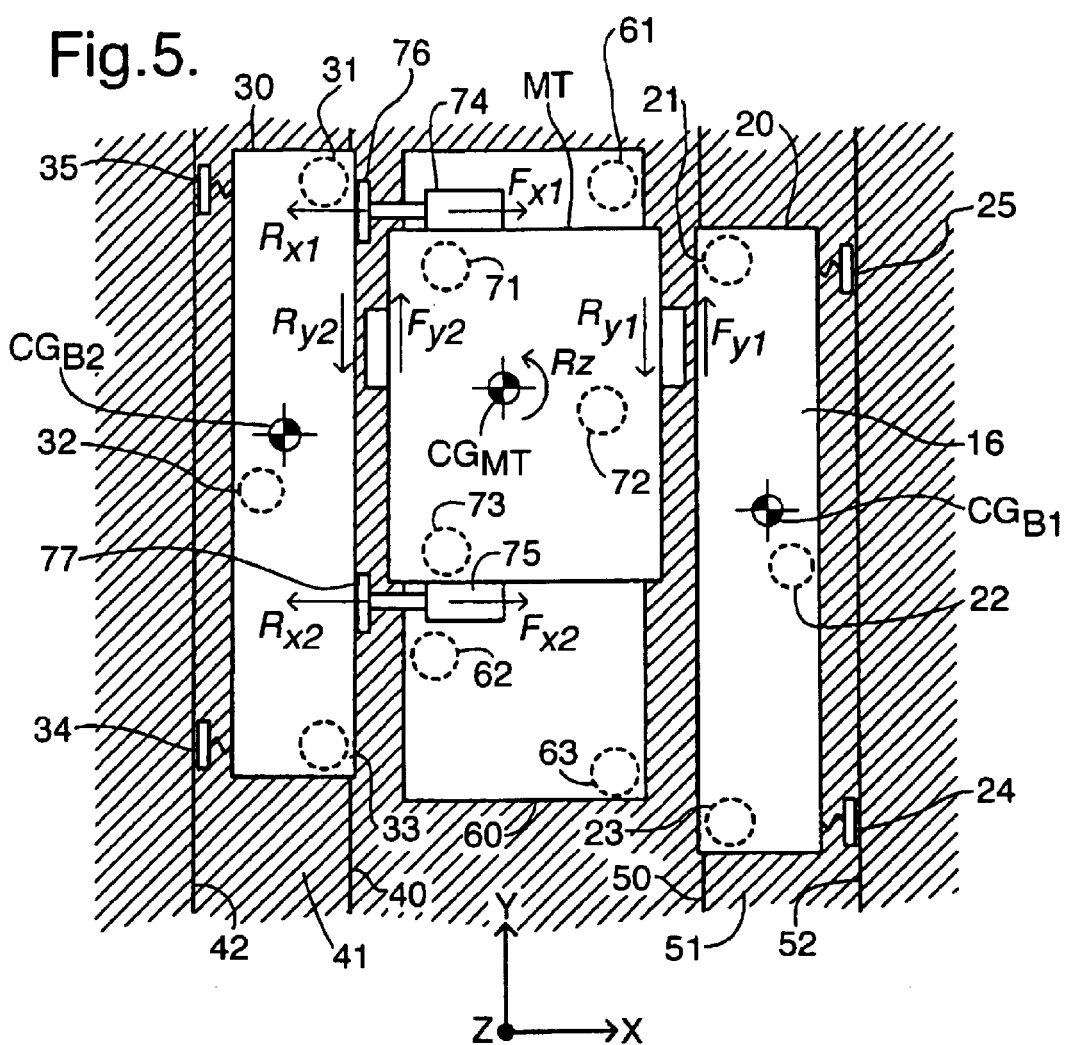
FIG. 5 is a plan view of the reticle stage of a second embodiment of the invention.
Figure 6:
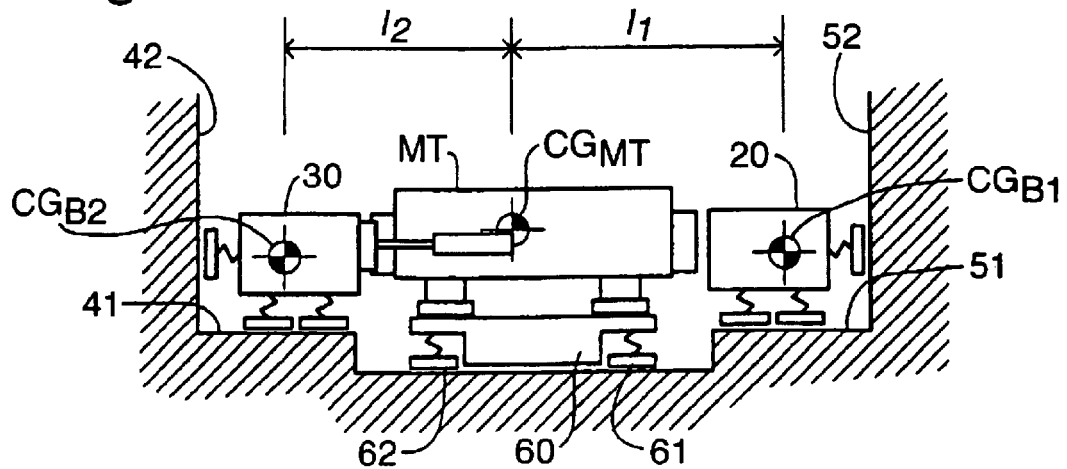
FIG. 6 is an end view of the reticle stage of the second embodiment of the invention.

A second embodiment of the invention is shown in FIGS. 5 and 6 and is essentially the same as the first embodiment except as noted below.

The second embodiment is particularly applicable to lithographic apparatus employing reflective masks so that the space underneath the mask table MT does not need to be kept clear. Advantage is taken of this fact to support the mask table MT over a third balance mass 60. Third balance mass 60 has a planar, horizontal upper surface over which is guided the mask table MT supported by bearings 71, 72, 73. These bearings may be, for example, gas bearings. Third balance mass 60 is in turn supported over the machine base frame by compliant bearings 61, 62, 63, which may comprise low stiffness springs. The third balance mass does not move in the XY plane so can alternatively be supported by leaf springs or gas cylinders without actual bearings. As illustrated, the second embodiment uses cylindrical voice coils 74, 75 in combination with X-bearings 76, 77 acting against the side of the second balance mass 30 for X-direction actuation. The X-bearings 76, 77 may be opposed pad bearings or preloaded so that forces in both directions can be exerted.

Embodiment 3

Figure 7:
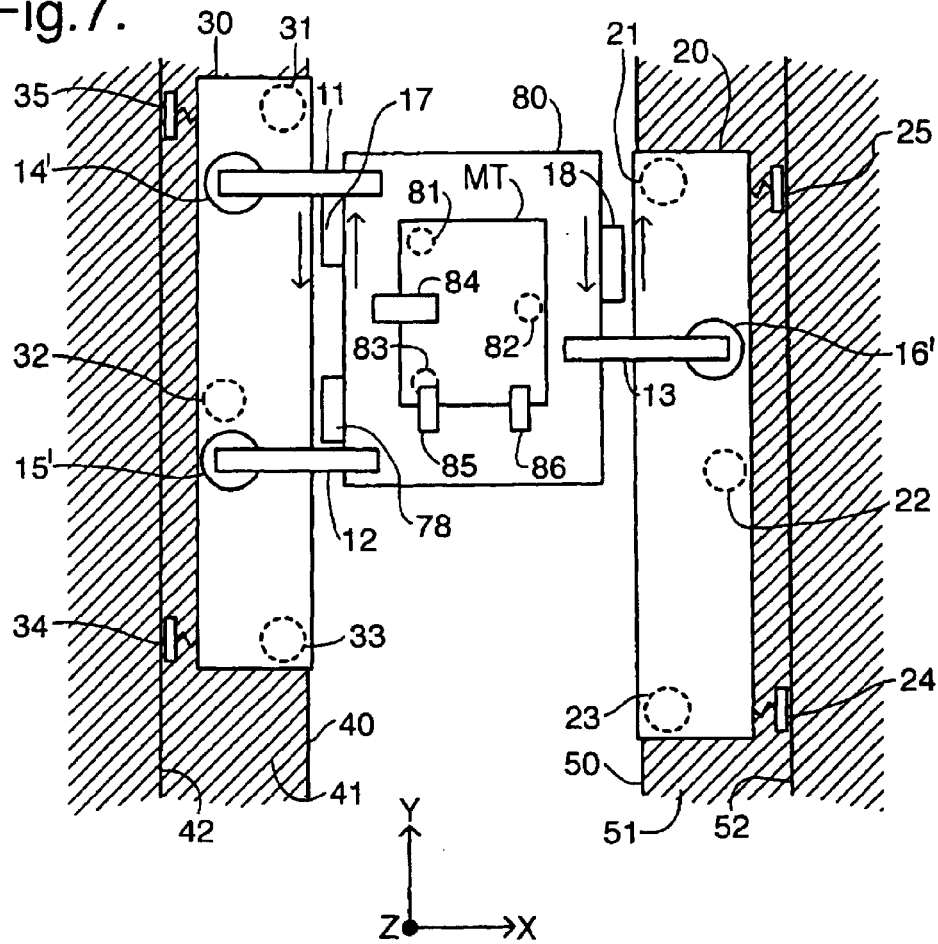
FIG. 7 is a plan view of the reticle stage of a third embodiment of the invention.
Figure 8:
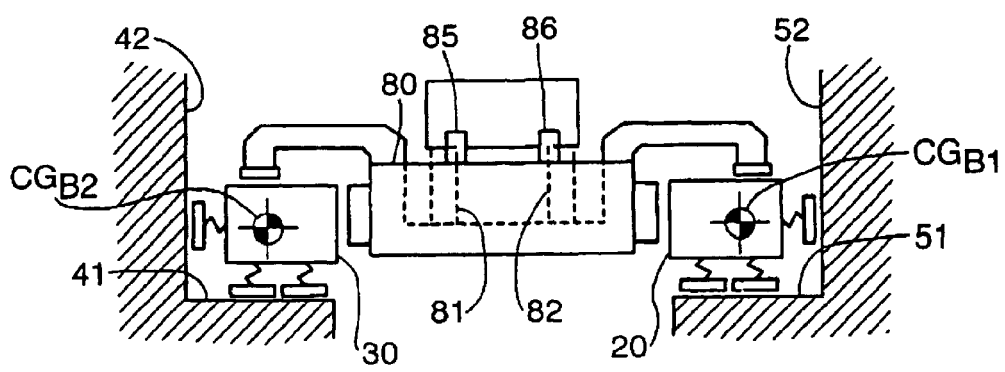
FIG. 8 is an end view of the reticle stage of the third embodiment of the invention.

In a third embodiment, shown in FIGS. 7 and 8 and which is the same as the first embodiment save as described below, the longstroke module positions a short, stroke frame 80 in Y and Rz only. Mask table MT is driven relative to the short stroke frame 80 to position the mask in six degrees of freedom to a high precision. Such positioning is effected by short stroke Z-actuators 81, 82, 83, X-actuator 84 and Y-actuators 85, 86. The short stroke frame 80 is supported over first and second balance masses 20, 30 by stiff Z-bearings 14', 15' 16', which may be gas bearings acting on the planar upper surface of the balance masses. Short stroke frame 80 is also constrained in X by bearing 78 relative to only one of the balance masses, in this case the second balance mass 30.

In the Y and Rz directions, the mask table MT moves with the short, stroke frame 80 so that in equations 2 and 3 the mass and moment of inertia, $m_{MT}$ and $J_{MT}$, should be replaced by the combined mass and moment of inertia of the mask table MT and short stroke frame 80. However, in the other degrees of freedom the short stroke frame 80 is constrained to move with the balance mass and so increases the effective balancing mass, reducing its stroke. The center of gravity of the mask table MT is preferably coplanar, or close to coplanar, with that of the short stroke frame 80 and balance masses 20, 30.

Embodiment 4

Figure 9:
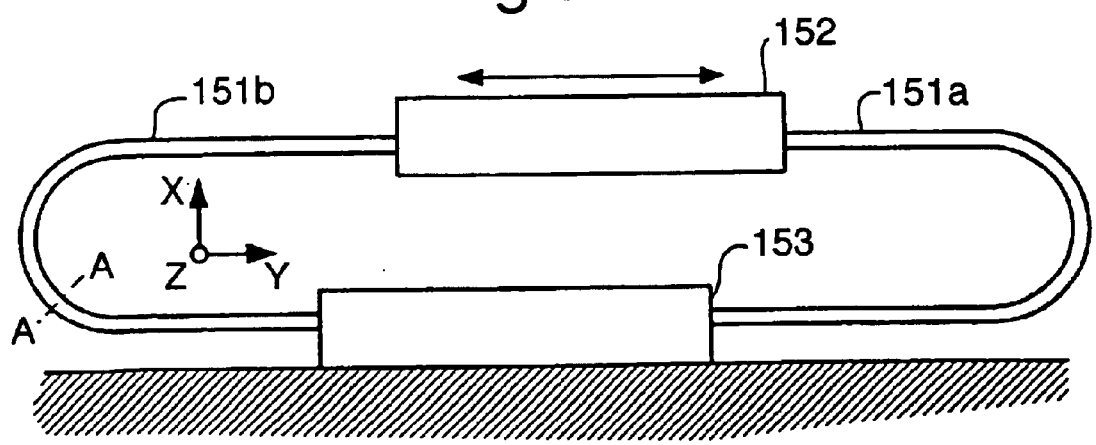
FIGS. 9 and 9A show a cable ducting device useable in embodiments of the invention.
Figure 9A:
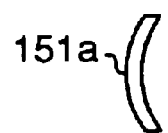

A cable ducting device according to a fourth embodiment of the invention is shown in FIGS. 9 and 9A. Two cable ducts 151a, 51b are used to carry cables and other conduits for utilities, such as control signals and power, required by the mask table. The two cable ducts 151a, 151b are laid out in opposite directions between a terminal 152 mounted on the mask table and a terminal 153 mounted on the machine frame so that as the mask table moves in the Y direction, one cable duct is rolling up and the other is unrolling. The total length of cable duct moving with the mask table therefore remains constant, whatever the Y position of the mask table. The moving mass therefore remains constant. Also, any residual tendencies of the cable ducts to roll up or unroll will counteract each other. The cable ducts 151a, 151b have a slightly curved cross-section, shown in FIG. 9A which is a cross-sectional view along the line A—A, in the same manner as a measuring tape. This prevents sagging and helps maintain a neat "U-shape" as the mask table moves.

Whilst we have described above specific embodiments of the invention it will be appreciated that the invention may be practiced otherwise than described. The description is not intended to limit the invention. In particular it will be appreciated that the invention may be used in the reticle or mask table of a lithographic apparatus and in any other type of apparatus where fast and accurate positioning of an object in a plane is desirable.

Although this text has concentrated on lithographic apparatus and methods whereby a mask is used to pattern the radiation beam entering the projection system, it should be noted that the invention presented here should be seen in the broader context of lithographic apparatus and methods employing generic "patterning means" to pattern the said radiation beam. The term "patterning means" as here employed refers broadly to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device. Besides a mask on a mask table, such patterning means include the following exemplary embodiments:

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

A programmable LCD array. An example of such a construction is given in U.S. Pat. No. 5,229,872, which is incorporated herein by reference.

What is claimed is:

1. A lithographic projection apparatus comprising:
   a radiation system which supplies a projection beam of radiation;
   a first object table constructed and arranged to hold a mask;
   a second object table constructed and arranged to hold a substrate;
   an imaging projection system configured to image irradiated portions of the mask onto target portions of the substrate;
   first and second balance masses disposed along opposite sides of at least one of the object tables; and
   first and second motors configured to move the at least one of the object tables, each motor having two cooperating electromagnetic members, a first of the members being operatively associated with the at least one of the object tables and a second of the members being operatively associated with at least one of the first and second balance masses, wherein said first and second balance masses are substantially free to move in at least a first direction to provide balancing to the at least one of the object tables, and
   wherein the at least one of the object tables is supported by a support structure that is substantially independent from the first and second balance masses.

2. The apparatus of claim 1, wherein said first direction is substantially parallel to a direction of motion of the at least one of the object tables.

3. The apparatus of claim 1, wherein said support structure has a planar upper surface.

4. The apparatus of claim 3, wherein the at least one of the object tables is provided with bearings, said bearings being configured to act on said planar surface to allow said at least one of the object tables to move substantially without friction relative to the support structure.

5. The apparatus of claim 1, wherein said apparatus is provided with actuators configured to move said at least one of the object tables in a direction substantially perpendicular to said first direction and to rotate said at least one of the object tables relative to at least said first direction.

6. The apparatus of claim 1, further comprising: a base structure; having a substantially flat horizontal upper surface, wherein said first and second balance masses are supported in a second direction substantially perpendicular to said first direction by a plurality of bearings acting upon said substantially flat horizontal upper surface.

7. The apparatus of claim 6, wherein said first and said second balance masses are free to move in said first direction over a relatively wide range of motion.

8. The apparatus of claim 6, wherein said first and second balance masses are free to move in a third direction substantially perpendicular to said first and said second directions, and the movement of said first and second balance masses in the third direction is provided by compliant bearings acting against substantially vertical walls of said parallel rails.

9. The apparatus of claim 6, wherein independent movement of the bearings acting upon the horizontal upper surfaces of the parallel rails provides rotational movement of said first and second balance masses around said first direction and said third direction.

10. The apparatus of claim 6, wherein said bearings have a low stiffness in said second direction such that at least one of said first and said second balance masses is substantially free to move in said second direction.

11. The apparatus of claim 1, wherein a mass of each of said first and second balance masses is 2 to 10 times larger than a mass of said at least one of the object tables.

12. The apparatus of claim 1, wherein a center of gravity of said first and second balancing masses and a center of gravity of said at least one of the object tables are located at less than 100 mm apart from each other in a direction perpendicular to said first direction.

13. The apparatus of claim 1, wherein said at least one of the object tables is driven in said first direction by the first motor acting between the at least one of the object tables and the first balance mass and by the second motor acting between the first object table and the second balance mass.

14. The apparatus of claim 1, wherein the first and second motors comprise linear motors, armatures mounted to the at least one of the object tables, and an elongate stator mounted to each of the first and second balance masses.

15. The apparatus of claim 13, wherein said at least one of the object tables is movable in a direction substantially perpendicular to said first direction by a third motor, and a line of action of said third motor passes through at least a position of a center of gravity of said at least one of the object tables in the first direction.

16. The apparatus of claim 1, further comprising a drift control which limits drift of the first and second balance masses.

17. The apparatus of claim 16, wherein the drift control comprises a servo control system and an actuator which applies forces to the first and second balance masses biasing a combined center of gravity of the first and second balance masses and the at least one of the object tables to a desired position.

18. The apparatus of claim 17, wherein the drift control has a servo bandwidth at least a factor of five lower than a lowest resonance frequency of the first and second balance masses and a base of the apparatus.

19. The apparatus of claim 16, wherein the drift control comprises an active system.

20. The apparatus of claim 16, wherein the drift control comprises a negative-feedback servo system.

21. The apparatus of claim 16, wherein the drift control comprises a passive system.

22. The apparatus of claim 16, wherein the drift control comprises at least one spring.

23. A lithographic projection apparatus comprising:
a radiation system which supplies a protection beam of radiation;
a first object table constructed and arranged to hold a mask;
a second object table constructed and arranged to hold a substrate;
an imaging projection system configured to image irradiated portions of the mask onto target portions of the substrate;
first and second balance masses disposed along opposite sides of at least one of the object tables; and
first and second motors configured to move the at least one of the object tables each motor having two cooperating electromagnetic members, a first of the members being operatively associated with the at least one of the object tables and a second of the members being operatively associated with at least one of the first and second balance masses, wherein said first and second balance masses are substantially free to move in at least a first direction to provide balancing to the at least one of the object tables, and
wherein the at least one of the object support by a third balance mass that is substantially independent from the first and second balance masses.

24. The apparatus of claim 1, further comprising a short stroke frame supported by said support structure.

25. The apparatus of claim 24, wherein said short stroke frame is movable in the first direction and a second direction perpendicular to said first direction.

26. The apparatus of claim 24, wherein the at least one of the object tables is driven relative to said short stroke frame in six degrees of freedom.

27. The apparatus of claim 1, wherein the at least one of the object tables comprises the first object table.

28. The apparatus of claim 1, wherein the at least one of the object tables comprises the second object table.

29. The apparatus of claim 1, wherein the first of the cooperating electromagnetic members comprises a coil and the second of the cooperating electromagnetic members comprises a magnet.

30. The apparatus of claim 1, wherein the first of the cooperating electromagnetic members comprises a magnet and the second of the cooperating electromagnetic members comprises a coil.

31. The apparatus of claim 1, wherein the first and second motors are configured to exert forces on said first and second balance masses in opposite directions to effect rotation of said at least one of the object tables.

32. The apparatus of claim 1, wherein the first and second motors are configured to exert forces on said first and second balance masses in opposite directions to effect rotation of said at least one object table around an axis perpendicular to a planar surface of said support structure.

33. A lithographic projection apparatus comprising:
a radiation system which supplies a projection beam of radiation;
a first object table constructed and arranged to hold a mask;
a second object table constructed and arranged to hold a substrate;
an imaging projection system configured to image irradiated portions of the mask onto target portions of the substrate;
first and second balance masses disposed along opposite sides of at least one of the object tables; and
first and second motors configured to move the at least one of the object tables, each motor having two cooperating electromagnetic members, a first of the members being operatively associated with the at least one of the object tables and a second of the members being operatively associated with at least one of the first and second balance masses, wherein said first and second balance masses are substantially free to move in at least a first direction to provide balancing to the at least on of the object tables, and wherein the at least one of the object tables is supported by a support structure that is independent from the first and second balance masses.

34. The apparatus of claim 33, wherein the support structure has a horizontal upper surface.

35. The apparatus of claim 33, wherein the support structure and the balance masses are supported on a common base frame.

36. The apparatus of claim 33, wherein the at least on of the object tables is supported by air bearings.

37. The apparatus of claim 36, wherein the common base frame is supported on vibration isolators.

38. The apparatus of claim 33, wherein each motor further comprises a longstroke positioning module and a short stroke positioning module.

39. The apparatus of claim 33, wherein the first and second motors are configured to exert forces on said first and second balance masses in opposite directions to effect rotation of said at least one of the object tables;

40. The apparatus of claim 33 wherein the first and second motors are configured to exert forces on said first and second balance masses in opposite directions to effect rotation of said at least one object table around an axis perpendicular to said horizontal upper surface.

41. A lithographic projection apparatus comprising:
a radiation system which supplies a projection beam of radiation;
a first object table constructed and arranged to hold a mask;
a second object table constructed and arranged to hold a substrate;
an imaging projection system configured to image irradiated portions of the mask onto target portions of the substrate;
first and second balance masses disposed along opposite sides of at least one of the object tables; and
first and second motors configured to move the at least one of the object tables, each motor having two cooperating electromagnetic members, a first of the members being operatively associated with the at least one of the object tables and a second of the members being operatively associated with at least one of the first and second balance masses, wherein said first and second balance masses are substantially free to move in at least a first direction to provide balancing to the at least one of the object tables, and
wherein the at least one of the object tables is at least partly supported by a support structure that is different from the first and second balance masses.

42. The apparatus of claim 41, wherein the support structure has a planar horizontal upper surface.

43. The apparatus of claim 41, wherein the support structure and the balance masses are supported on a common base frame.

44. The apparatus of claim 41, wherein the at least one of the object tables is supported by air bearings.

45. The apparatus of claim 43, wherein the common base frame is supported on vibration isolators.

46. The apparatus of claim 41, wherein each motor further comprises a coarse positioning module and a fine positioning module.

47. The apparatus of claim 41, wherein the first and second motors are configured to exert forces on said first and second balance masses in opposite directions to effect rotation of said at least one of the object tables.

48. Apparatus of claim 47, wherein said rotation is around an axis parallel to the projection beam of radiation.

49. A lithographic projection apparatus comprising:
a radiation system which supplies a projection beam of radiation;
a first object table constructed and arranged to hold a mask;
a second object table constructed and arranged to hold a substrate;
an imaging projection system configured to image irradiated portions of the mask onto target portions of the substrate;
first and second balance masses disposed along opposite sides of at least one of the object tables;
a support structure for supporting the at least one of the object tables; and
first and second motors configured to move the at least one of the object tables, each motor having two cooperating electromagnetic members, a first of the members being operatively associated with the at least one of the object tables and a second of the members being operatively associated with at least one of the first and second balance masses, wherein said first and second balance masses are substantially free to move in at least a first direction to provide balancing to the at least one of the object tables.

50. The apparatus of claim 49, wherein the support structure has a planar horizontal upper surface.

51. The apparatus of claim 49, wherein the support structure and the balance masses are supported on a common base frame.

52. The apparatus of claim 49, the at least one of the object tables is supported by air bearings.

53. The apparatus of claim 51, wherein the common base frame is supported on vibration isolators.

54. The apparatus of claim 49, wherein each motor further comprises a longstroke positioning module and a short stroke positioning module.

55. The apparatus of claim 49, wherein the first and second motors are configured to exert forces on said first and second balance masses in opposite directions to effect rotation of said at least one of the object tables.

56. The apparatus of claim 1, further comprising: a base structure; and parallel rails coupled to said base structure, said parallel rails having substantially flat horizontal upper surfaces, wherein said first and second balance masses are supported in a second direction substantially perpendicular to said first direction by a plurality of bearings acting upon said substantially flat horizontal upper surfaces.

57. A lithographic projection apparatus comprising:
a radiation system which supplies a projection beam of radiation;
a first object table for holding a mask;
a second object table for holding a substrate;
an imaging projection system which images irradiated portions of the mask onto target portions of the substrate;
a balanced object table positioning system which positions at least one of said object tables;
first and second balance masses;
a support structure for supporting the at least one of the object tables
a bearing, supporting each of said first and second balance masses such that they are substantially free to translate in at least a first direction;
actuators which act between said at least one of the object tables and said first and second balance masses to rotate said at least one of the object tables about an axis perpendicular to said first direction, and a drift control which limits drift of said balance masses constructed and arranged to apply a biasing force to the balance masses such that the combined center of mass of the balance masses, the object table positioning system and the at least one of the object tables is biased towards a desired position.

58. A lithographic projection apparatus comprising:

a radiation system which supplies a projection beam of radiation;

a first object table for holding a mask;

a second object table for holding a substrate;

an imaging projection system which images irradiated portions of the mask onto target portions of the substrate;

first and second balance masses;

a support structure for supporting at least one of the object tables;

a balanced object table positioning system which positions said at least one of said object tables and at least partially supported by at least one of the balance masses;

a bearing for supporting each of said first and second balance masses such that they are substantially free to translate in at least a first direction; and actuators being arranged to exert forces on said first and second balance masses in opposite directions to effect rotation of said at least one of said object tables.

59. A lithographic projection apparatus comprising:

a radiation system which supplies a projection beam of radiation;

a first object table for holding a mask;

a second object table for holding a substrate;

an imaging projection system which images irradiated portions of the mask onto target portions of the substrate;

first and second balance masses;

a support structure for supporting at least one of the object tables;

a balanced object table positioning system which positions the at least one of said object tables and at least partially supported by at least one of the balance masses;

a bearing, supporting each of said first and second balance masses such that they are substantially free to translate in at least a first direction; and actuators being arranged to exert forces on said first and second balance masses in opposite directions to effect rotation of said at least one of the object tables, said actuators being constructed and arranged such that forces applied by the actuators onto the at least one of the object tables result in equal reaction forces being applied by the actuators on the balance masses.

60. A lithographic apparatus comprising:

a patterning means;

an object table constructed and arranged to hold a substrate;

an imaging projection system configured to image irradiated portions of the patterning means onto target portions of the substrate;

first and second balance masses disposed along opposite sides of the object table;

a support structure for supporting the object table; and first and second motors configured to move the object table, each motor having two cooperating electromagnetic members, a first of the members being operatively associated with the object table and a second of the members being operatively associated with at least one of the first and second balance masses, wherein said first and second balance masses are substantially free to move in at least a first direction to provide balancing of the object table.

61. A lithographic apparatus comprising:

a radiation system which supplies a projection beam of radiation;

a first object table constructed and arranged to hold a patterning means;

a second object table constructed and arranged to hold a substrate;

a projection system configured to image irradiated portions of the patterning means onto target portions of the substrate;

first and second balance masses disposed along opposite sides of at least one of the object tables;

a support structure for supporting the at least one of the object tables; and first and second motors configured to move the at least one of the object tables, each motor having two cooperating electromagnetic members, a first of the members being operatively associated with the at least one of the object tables and a second of the members being operatively associated with at least one of the first and second balance masses, wherein said first and second balance masses are substantially free to move in at least a first direction to provide balancing to the at least one of the object tables.

* * * * *